US006829177B2

(12) United States Patent
Bedarida et al.

(10) Patent No.: US 6,829,177 B2
(45) Date of Patent: Dec. 7, 2004

(54) OUTPUT BUFFER FOR A NONVOLATILE MEMORY WITH OPTIMIZED SLEW-RATE CONTROL

(75) Inventors: Lorenzo Bedarida, Vimercate (IT); Andrea Corradi, Cremona (IT); Maria Mostola, Cernusco sul Naviglio (IT); Massimo Zucchinali, Seriate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/161,055

(22) Filed: May 30, 2002

(65) Prior Publication Data

US 2003/0059997 A1 Mar. 27, 2003

(30) Foreign Application Priority Data

Jun. 1, 2001 (IT) .................................... TO2001A0531

(51) Int. Cl.[7] ............................................. G11C 16/04
(52) U.S. Cl. ............................. 365/189.05; 365/230.08
(58) Field of Search ........................ 365/230.08, 189.05

(56) References Cited

U.S. PATENT DOCUMENTS

| 4,570,091 | A | * | 2/1986 | Yasuda et al. ................. 326/87 |
| 5,293,081 | A | * | 3/1994 | Chiao et al. .................. 327/108 |
| 5,539,335 | A | * | 7/1996 | Kobayashi et al. ............ 326/81 |
| 5,798,970 | A | * | 8/1998 | Ong ........................ 365/189.05 |
| 6,072,354 | A | * | 6/2000 | Tachibana et al. ........... 327/390 |
| 6,141,263 | A | 10/2000 | Protzman ................ 365/189.11 |

* cited by examiner

*Primary Examiner*—Richard Elms
*Assistant Examiner*—Tuan T. Nguyen
(74) *Attorney, Agent, or Firm*—Lisa K. Jorgenson; Harold H. Bennett, II; Seed IP Law Group PLLC

(57) ABSTRACT

An output buffer includes an output stage formed by a pull-up transistor and a pull-down transistor connected in series between a supply line set at a supply potential and a ground line set at a ground potential. The output buffer further includes a pre-biasing stage for pre-biasing the control terminal of the pull-up transistor and a pre-biasing stage for pre-biasing the control terminal of the pull-down transistor in order to bring these transistors to the turning-on threshold.

11 Claims, 2 Drawing Sheets

OUTPUT BUFFER FOR A NONVOLATILE MEMORY WITH OPTIMIZED SLEW-RATE CONTROL

BACKGROUND OF THE INVENTION

1. Field of the Invention

The present invention relates to an output buffer for a nonvolatile memory with optimized slew-rate control.

2. Description of the Related Art

As is known, at present the semiconductor device market demands the manufacture of memory devices having increasingly higher operating frequencies, and this results in the need to have available output buffers with increasingly higher switching speeds.

These switching speeds are currently obtained by increasing the intensity of the current supplied by the output buffers, and this increase in the output current is obtained by increasing the size of the output buffers.

However, the larger the sizes of the output buffers, the higher the currents that they absorb during the switching phase, and these currents consequently create sharp drops or dumps in the supply voltage of the memory devices, these dumps concurring in considerably reducing the setting time, and hence the reading time, of the memory devices.

In particular, the dumps in the supply voltage of the memory devices define the so-called "switching noise" of memory devices and are closely linked to parameters that are often not controllable, such as the inductive characteristics of the supply path, the number of output buffers switching simultaneously, the value of the supply voltage of the memory device, etc.

In order to reduce switching noise, numerous techniques for controlling the slew rate of output buffers have been proposed, most of which are essentially based upon the principle of limiting the time derivative of the current absorbed by the output buffers by reducing the charging and discharging speed of the gate terminals of the pull-up and pull-down transistors of the output stages of the output buffers during the turning-on step of the latter.

In particular, slowing-down of charge and discharge of the gate terminals of the pull-up and pull-down transistors of the output stages of output buffers is currently obtained by acting on the logic inverters that control the pull-up and pull-down transistors in two different alternative ways: either using resistive transistors or by means of current control.

In detail, the former technique consists in rendering resistive the pull-down transistor of the logic inverter that controls the pull-up transistor of the output stage and the pull-up transistor of the logic inverter that controls the pull-down transistor of the output stage, whilst the latter technique consists in current-controlling the pull-down transistor of the logic inverter that controls the pull-up transistor of the output stage and of the pull-up transistor of the logic inverter that controls the pull-down transistor of the output stage.

Although the above-mentioned techniques enable a reduction in the time derivative of the current absorbed by output buffers and an improvement in the immunity to switching noise of output buffers, they present, however, a drawback that does not enable adequate exploitation of all their advantages.

In particular, the major undesired effect of these techniques is that of introducing a further switching delay of output buffers in addition to the delay caused by the high capacitance typically connected to the outputs of the output buffers, this delay concurring in reducing the maximum switching speed, and hence the maximum switching frequency, of output buffers.

BRIEF SUMMARY OF THE INVENTION

An embodiment of the present invention provides an output buffer for a memory device and a memory device that are free from the drawbacks described above.

According to an embodiment of the present invention, an output buffer for a memory device is provided. The output buffer includes an output stage formed by a pull-up transistor and a pull-down transistor connected in series between a supply line set at a supply potential and a ground line set at a ground potential. The output buffer further includes a pre-biasing stage for pre-biasing the control terminal of the pull-up transistor and a pre-biasing stage for pre-biasing the control terminal of the pull-down transistor in order to bring these transistors to the turning-on threshold.

According to another embodiment of the present invention, a memory device is also provided, including an output buffer as described above.

Another embodiment of the invention provides a method, including inputting a first logic value to an input of an output buffer, inputting a second logic value, different from the first value, to the input, switching an output of the output buffer from the first logic value to the second logic value by turning off a first transistor coupled between the output and a first line at a first potential and turning on a second transistor coupled between the output and a second line at a second potential, and biasing the first transistor at its turning-on threshold.

BRIEF DESCRIPTION OF THE SEVERAL VIEWS OF THE DRAWING(S)

For a better understanding of the present invention, two preferred embodiments thereof are now described, purely by way of non-limiting example, with reference to the attached drawings, in which.

DETAILED DESCRIPTION OF THE INVENTION

The present invention is based upon the principle of pre-biasing or pre-charging the gate terminals of the pull-up and pull-down transistors of the output stages of output buffers at a voltage such as to bring these transistors to the turning-on threshold, so as to reduce the switching delay of the transistors.

In fact, as is known, in a transistor the duration of the transition from a off condition to an on condition basically depends upon the value of the supply voltage and upon the value of its threshold voltage, and in current applications at low supply voltages of memory devices, which are typical of portable devices, such as cell phones, digital cameras, MP3 players, smartcards, etc., or of consumer electronics, it has been experimentally verified that over one third of the switching delay of output buffers can be put down to the transition of the transistors from the off condition to the on condition.

In particular, in an output buffer of a nonvolatile memory, transition of the pull-up and pull-down transistors of the output stage from the off condition to the on condition can be quantified in a few nanoseconds and represents an undesired delay which becomes particularly significant in current applications of memory devices in which operation is at low supply voltages and at switching frequencies of over 60 MHz.

Pre-biasing or pre-charging of the gate terminals of the pull-up and pull-down transistors of the output stages of output buffers enables, instead, complete elimination of the contribution to the switching delay of the output buffers that may be attributed to the transition from the off condition to the on condition of the transistors that forms the output buffers.

Figure 1:
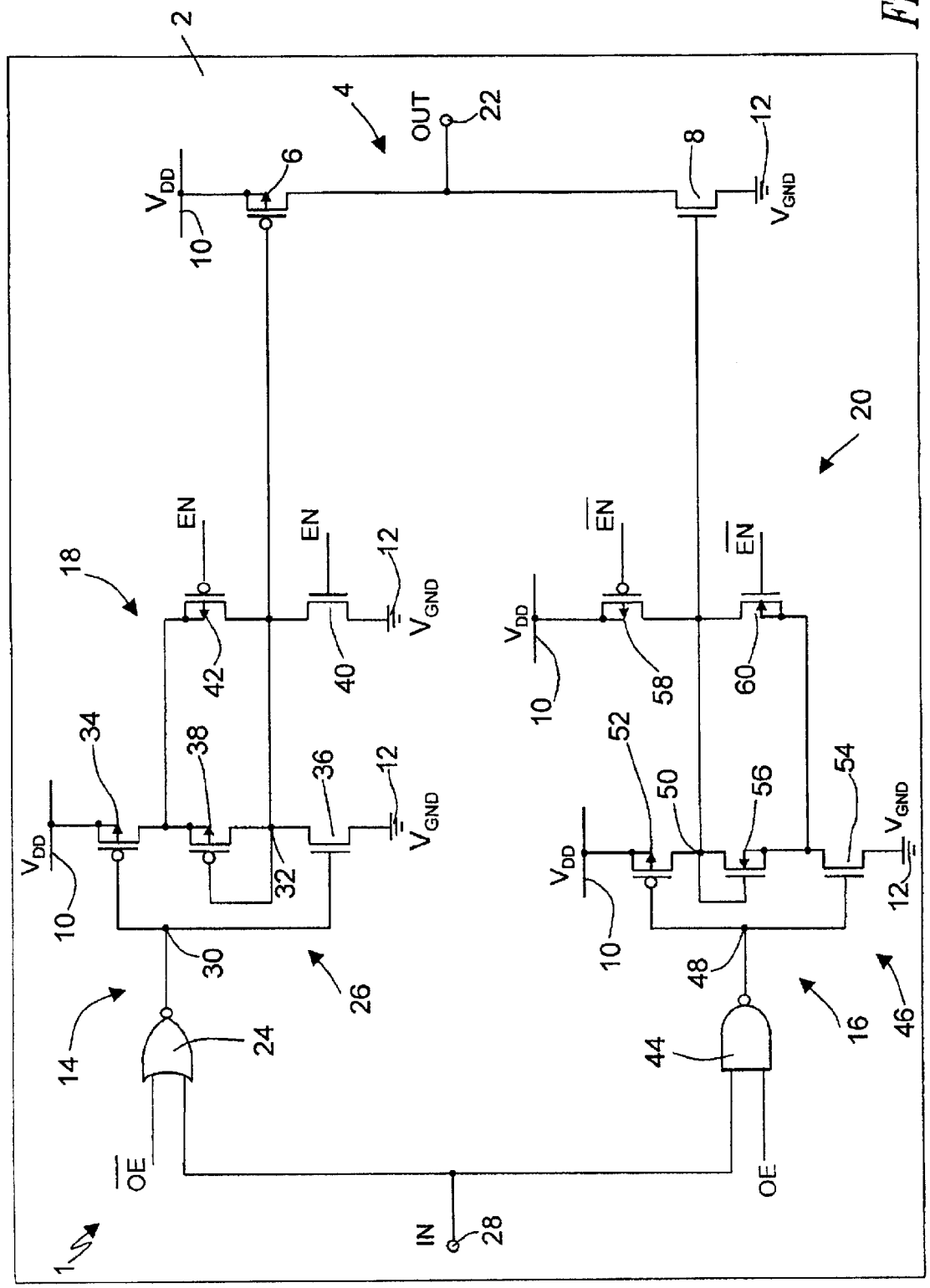
FIG. 1 shows the circuit diagram of an output buffer according to a first embodiment of the present invention.

FIG. 1 shows the circuit diagram of an output buffer according to a first embodiment of the present invention.

In particular, in FIG. 1 the reference number 1 designates, as a whole, an output buffer, whilst the nonvolatile memory of which the output buffer 1 forms part is schematically illustrated with a thin line and is designated by 2.

As illustrated in FIG. 1, the output buffer 1 comprises an output stage 4 formed by a PMOS pull-up transistor 6 and an NMOS pull-down transistor 8, which are connected in series between a supply line 10 set at a supply voltage $V_{DD}$ and a ground line 12 set at a ground voltage $V_{GND}$, a driving stage 14 for driving the pull-up transistor, a driving stage 16 for driving the pull-down transistor, a pre-biasing stage 18 for pre-biasing the gate terminal of the pull-up transistor 6, and a pre-biasing stage 20 for pre-biasing the gate terminal of the pull-down transistor 8.

In particular, the pull-up transistor 6 has source and bulk terminals connected to the supply line 10, a drain terminal connected to the output 22 of the output buffer 1, and a gate terminal connected to the output of the respective driving stage 14, whilst the pull-down transistor 8 has a source terminal connected to the ground line 12, a drain terminal connected to the output 22 of the output buffer 1, and a gate terminal connected to the output of the respective driving stage 16.

The driving stage 14 for driving the pull-up transistor 6 comprises a NOR logic gate 24 and a logic inverter 26 cascaded together between the input 28 of the output buffer 1 and the gate terminal of the pull-up transistor 6.

In particular, the logic gate 24 has a first input receiving an inverted enabling signal $\overline{OE}$ via which the user can enable/disable the output buffer 1, a second input connected to the input 28 of the output buffer 1, and an output connected to an input 30 of the logic inverter 26, the output 32 of which is connected to the gate terminal of the pull-up transistor 6.

The logic inverter 26 comprises a PMOS pull-up transistor 34 and an NMOS pull-down transistor 36 having gate terminals connected together and defining the input 30 of the logic inverter 26, source terminals respectively connected to the supply line 10 and to the ground line 12, and drain terminals connected to the output 32 of the logic inverter 26.

The pre-biasing stage 18 for pre-biasing the gate terminal of the pull-up transistor 6 basically comprises a PMOS transistor 38, which is diode-connected and is connected between the gate terminal of the pull-up transistor 34 of the logic inverter 26 and the output 32 of the logic inverter 26, and an NMOS transistor 40 connected between the output 32 of the logic inverter 26 and the ground line 12.

In particular, the PMOS transistor 38 has source and bulk terminals connected to the drain terminal of the pull-up transistor 34 of the logic inverter 26, and gate and drain terminals connected to the output 32 of the logic inverter 26, whilst the NMOS transistor 40 has a drain terminal connected to the output 32 of the logic inverter 26, a source terminal connected to the ground line 12, and a gate terminal receiving a logic control signal EN which assumes a high logic level for enabling the pre-biasing stage 18 and a low logic level for disabling the pre-biasing stage 18.

The pre-biasing stage 18 for pre-biasing the gate terminal of the pull-up transistor 6 further comprises a PMOS transistor 42 connected in parallel to the PMOS transistor 38 and having source and bulk terminals connected to the source terminal of the PMOS transistor 38, a drain terminal connected to the output 32 of the logic inverter 26, and a gate terminal receiving the control signal EN.

The driving stage 16 for driving the pull-down transistor 8 basically comprises a NAND logic gate 44 and a logic inverter 46 cascaded together between the input 24 of the output buffer 1 and the gate terminal of the pull-down transistor 8.

In particular, the logic gate 44 has a first input receiving an enabling signal OE obtained by inverting the inverted enabling signal $\overline{OE}$, a second input connected to the input 28 of the output buffer 1, and an output connected to an input 48 of the logic inverter 46, the output 50 of which is connected to the gate terminal of the pull-down transistor 8.

The logic inverter 46 comprises a PMOS pull-up transistor 52 and an NMOS-type pull-down transistor 54 having gate terminals connected to the input 48 of the logic inverter 46, source terminals respectively connected to the supply line 10 and to the ground line 12, and drain terminals connected to the output 50 of the logic inverter 46.

The pre-biasing stage 20 for pre-biasing the gate terminal of the pull-down transistor 8 comprises an NMOS transistor 56, which is diode-connected and is connected between the drain terminal of the pull-down transistor 54 of the logic inverter 46 and the output 50 of the logic inverter 46, and a PMOS transistor 58 connected between the output 50 of the logic inverter 46 and the supply line 10.

In particular, the NMOS transistor 56 has source and bulk terminals connected to the drain terminal of the pull-down transistor 54 of the logic inverter 46, and gate and drain terminals connected to the output 50 of the logic inverter 46, whilst the PMOS transistor 58 has a drain terminal connected to the output 50 of the logic inverter 46, source and bulk terminals connected to the supply line 10, and a gate terminal receiving an inverted control signal $\overline{EN}$ obtained by inverting the aforesaid control signal EN.

The pre-biasing stage 20 for pre-biasing the gate terminal of the pull-down transistor 8 further comprises an NMOS transistor 60 connected in parallel to the NMOS transistor 56 and having a source terminal connected to the source terminal of the NMOS transistor 56, a drain terminal connected to the output 50 of the logic inverter 46, and a gate terminal receiving the aforesaid inverted control signal $\overline{EN}$.

Operation of the output buffer 1 is generally known and consequently will be described only as regards the pre-biasing stages 18, 20 for pre-biasing the gate terminals of the pull-up and pull-down transistors 6, 8.

In particular, as regards the pre-biasing stage 18, when it is desired to pre-bias the gate terminal of the pull-up transistor 6, the control signal EN is made to switch to a high logic level. In this operating condition, the NMOS transistor 40 is on, whilst the PMOS transistor 42 is off. Consequently, a current path is created between the supply line 10 and the ground line 12 via the pull-up transistor 34 of the logic inverter 26, the PMOS transistor 38 and the NMOS transistor 40, thus determining pre-charging and consequent pre-biasing of the gate terminal of the pull-up transistor 6 of the output stage 4 of the output buffer 1.

In particular, the voltage at which the gate terminal of the pull-up transistor 6 is pre-biased is a function of the sizing of the PMOS transistor 38 and NMOS transistor 40. Consequently, the transistors 38, 40 are sized in such a way that the voltage $V_G$ at which the gate terminal of the pull-up transistor 6 is pre-charged is such as to bring the pull-up transistor 6, but not beyond, to the conduction threshold, in particular a threshold equal to the supply voltage $V_{DD}$ diminished by the threshold voltage $V_{THP}$ of a PMOS transistor, namely $V_G=V_{DD}-V_{THP}$.

In this way, when the driving stage 14 controls turning-on of the pull-up transistor 6, the latter turns on practically immediately in so far as the delay attributable to the transition from the off condition to the conduction threshold is no longer present. In this way, a significant increase is achieved in the maximum frequency at which the output buffer 1 can operate, as compared to the maximum frequency of the output buffers according to the prior art.

The control signal EN is instead made to switch to a low logic level when it is desired to bring the output buffer 1 back to the standard configuration in which no pre-biasing of the gate terminal of the pull-up transistor 6 is carried out. In this operating condition, in fact, the NMOS transistor 40 is off, whilst the PMOS transistor 42 is on and short-circuits the PMOS transistor 38.

Operation of the pre-biasing stage for pre-biasing the gate terminal of the pull-down transistor 8 of the output stage 4 is similar to that of the pre-biasing stage for pre-biasing the gate terminal of the pull-up transistor 6, and consequently will not be described again.

It is only pointed out that pre-biasing of the gate terminal of the pull-down transistor 8 is carried out simultaneously with the pre-biasing of the gate terminal of the pull-up transistor 6 in so far as both the PMOS transistor 58 and the NMOS transistor 60 receive the inverted control signal $\overline{EN}$, and consequently the PMOS transistor 58 is on and the NMOS transistor 60 is off when the control signal EN assumes a high logic level (inverted control signal $\overline{EN}$ low), whilst the NMOS transistor 60 is on and short-circuits the NMOS transistor 56 when the control signal EN assumes a low logic level (inverted control signal $\overline{EN}$ high).

In a way similar to what has been previously described for the pre-biasing stage 18, the voltage at which the gate terminal of the pull-down transistor 8 is pre-biased is a function of the sizing of the NMOS transistor 56 and PMOS transistor 58. Consequently, these transistors are sized in such a way that the voltage $V_G$ at which the gate terminal of the pull-down transistor 8 is pre-charged is such as to bring the pull-down transistor 8 to the conduction threshold, in particular a threshold equal to the ground voltage $V_{GND}$ increased by the threshold voltage $V_{THN}$ of an NMOS transistor, namely $V_G=V_{GND}+V_{THN}$.

It will be appreciated that "pre-biasing the gate terminals to the conduction threshold" includes pre-biasing the gate terminals at or near the conduction threshold, so as to reduce the time for turning on the pull-up transistor 6 and turning-off the pull down transistor 8. Of course, the gate terminals of the output transistors 6 and 8 are not pre-biased beyond their respective conduction thresholds; otherwise the pre-biasing stages would switch the logic state of the output buffer before the input switches its logic state.

Figure 2:
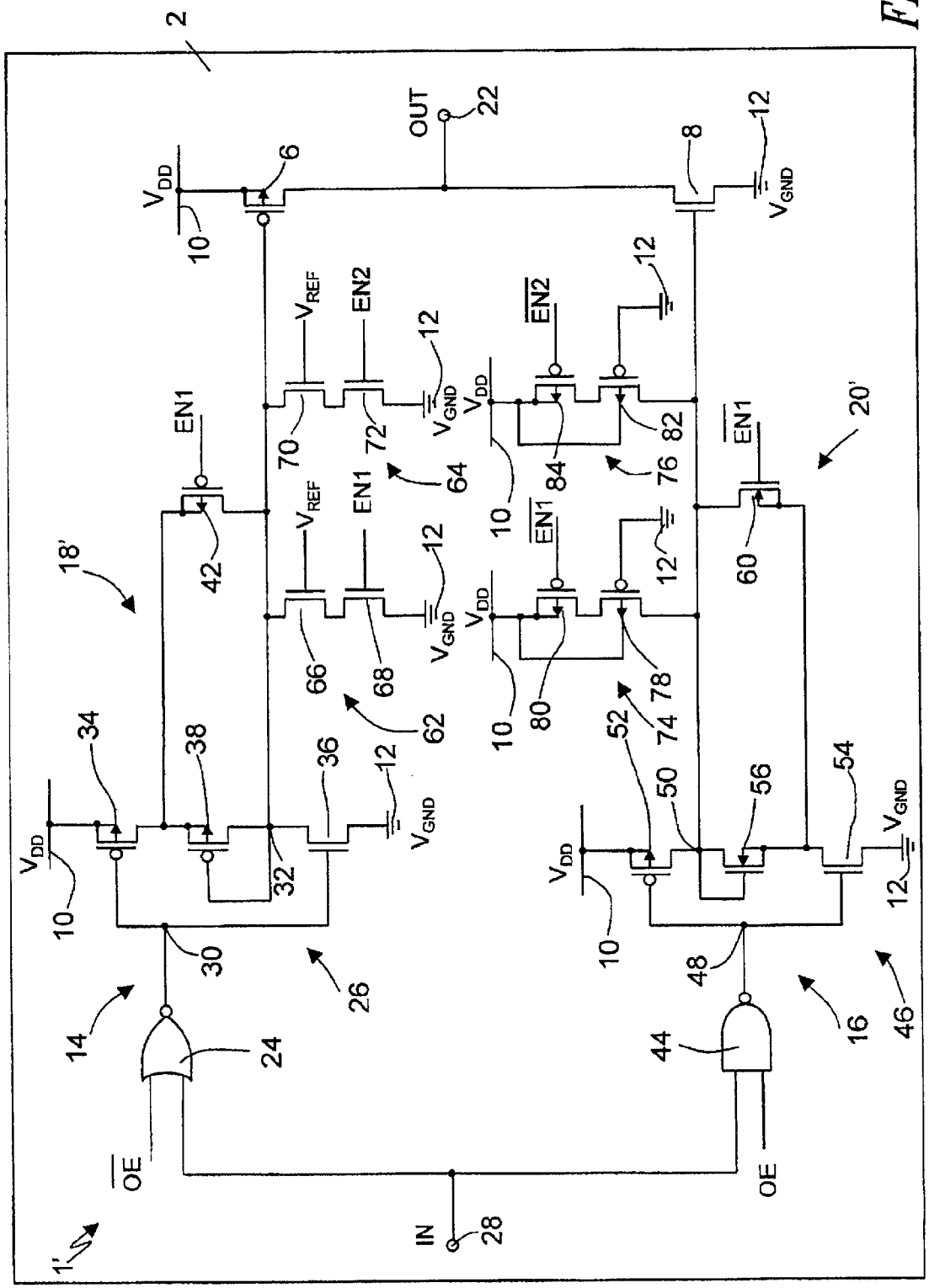
FIG. 2 shows the circuit diagram of an output buffer according to a second embodiment of the present invention.

FIG. 2 illustrates an output buffer according to a second embodiment of the present invention, in which parts that are identical to those of FIG. 1 are designated by the same reference numbers.

In particular, the output buffer of FIG. 2, designated by 1', differs from the output buffer 1 of FIG. 1 in the structure of the pre-biasing stages for pre-biasing the gate terminals of the pull-up transistor 6 and pull-down transistor 8.

In detail, the pre-biasing stage for pre-biasing the gate terminal of the pull-up transistor 6, here designated by 18', differs from the pre-biasing stage 18 in that connection of the gate terminal of the pull-up transistor 6 to the ground line 12 is obtained, instead of via the NMOS transistor 40 alone, via a fast-precharging branch 62 and a holding branch 64, which are connected in parallel between the output 32 of the logic inverter 26 and the ground line 12, and each of which is formed by a pair of NMOS transistors connected in series and respectively designated by 66, 68 and 70, 72.

Likewise, the pre-biasing stage for pre-biasing the gate terminal of the pull-down transistor 8, here designated by 20', differs from the pre-biasing stage 20 in that connection of the gate terminal of the pull-down transistor 8 to the supply line 10 is obtained, instead of via the PMOS transistor 58 alone, via a fast-precharging branch 74 and a holding branch 76, which are connected in parallel between the output 50 of the logic inverter 46 and the ground line 10, and each of which is formed by a pair of PMOS transistors connected in series and respectively designated by 78, 80 and 82, 84.

In particular, in the pre-biasing stage 18' for pre-biasing the gate terminal of the pull-up transistor 6, the transistor 66 of the fast-precharging branch 62 has a drain terminal connected to the output 32 of the logic inverter 26, a source terminal connected to a drain terminal of the transistor 68, and a gate terminal receiving a reference voltage $V_{REF}$ (1.21 V) which is temperature stable and is generated by a band-gap voltage generator (not illustrated), whilst the second transistor 68 of the fast-precharging branch 62 is a high-conductivity transistor (i.e., one having a high W/L ratio) and has a source terminal connected to the ground line 12 and a gate terminal receiving a first control signal EN1.

The transistor 70 of the holding branch 64 has a drain terminal connected to the output 32 of the logic inverter 26, a source terminal connected to a drain terminal of the transistor 72, and a gate terminal receiving the reference voltage $V_{REF}$, whilst the transistor 72 of the holding branch 64 is a transistor having a conductivity lower than that of the transistor 68 of the fast-precharging branch 62 (i.e., it has a lower W/L ratio) and has a source terminal connected to the ground line 12 and a gate terminal receiving a second control signal EN2.

In the pre-biasing stage 20' for pre-biasing the gate terminal of the pull-down transistor 8, the transistor 78 of the fast-precharging branch 74 has a drain terminal connected to the output 50 of the logic inverter 46, a source terminal connected to a drain terminal of the transistor 80, a bulk terminal connected to the supply line 10, and a gate terminal connected to the ground line 12, whilst the transistor 80 is a high-conductivity transistor and has source and bulk terminals connected to the supply line 10, and a gate terminal receiving the inverted first control signal $\overline{EN1}$.

The transistor 82 of the holding branch 76 has a drain terminal connected to the output 50 of the logic inverter 46, a source terminal connected to a drain terminal of the transistor 84, a bulk terminal connected to the supply line 10, and a gate terminal connected to the ground line 12, whilst the transistor 84 has source and bulk terminals connected to the supply line 10, and a gate terminal receiving the inverted second control signal $\overline{EN2}$.

Operation of the output buffer 1' is generally known, and consequently will be described only as regards the pre-biasing stages 18', 20' for pre-biasing the gate terminals of the pull-up transistor 6 and pull-down transistor 8.

In particular, as regards pre-biasing of the gate terminal of the pull-up transistor 6, it is carried out by activating initially both the fast-precharging branch 62 and the holding branch 64 to carry out fast pre-charging, and by then de-activating the fast-precharging branch 62.

In fact, when the fast-precharging branch 62 and the holding branch 64 are both active (control signals EN1 and EN2 at a high logic level), the high conductivity of the transistor 68 of the fast-precharging branch 62 brings about a very large current flow between the supply line 10 and the ground line 12, thus enabling extremely fast pre-biasing of the gate terminal of the pull-up transistor 6 at a voltage $V_G = V_{DD} - V_{THP}$.

Once the fast-precharging step is concluded, the fast-precharging branch 62 is deactivated (control signal EN1 low), and only the holding branch 64 is kept active to maintain the gate terminal of the pull-up transistor 6 at the biasing voltage $V_G$.

The holding branch 62 is, instead, deactivated (control signal EN2 low) only when it is desired to bring the output buffer 1' into its standard configuration in which no pre-biasing of the gate terminal of the pull-up transistor 6 is performed.

Since the NMOS transistors 66, 70 have gate terminals biased at a reference voltage VREF which is temperature stable, they are always on and perform the only function of increasing the conductivity of the respective branches.

Operation of the pre-biasing stage 20' for pre-biasing the gate terminal of the pull-down transistor 8 is similar to that of the pre-biasing stage for pre-biasing the gate terminal of the pull-up transistor 6, and consequently will not be described again.

The advantages that the present invention makes possible emerge clearly from an examination of its characteristics.

In particular, the present invention enables complete elimination of the contribution to the switching delay of output buffers that may be put down to the transition of the pull-up and pull-down transistors of the output stages from the off condition to the on condition; there is thus determined a significant increase in the maximum switching frequency of the output buffers and, consequently, in the maximum frequency at which the nonvolatile memory can operate.

The advantage in terms of switching frequency of output buffers is moreover particularly significant at high frequencies, in particular for frequencies in the region of 60 MHz, and at low supply voltages.

In fact, in the field of memory devices there is an increasing trend in the direction of operation at low supply voltages (<1.35 V), and this means that, if the threshold voltages of the transistors are kept unvaried, the "waiting times" represented by the switching of the transistors increase considerably. The present invention, instead, enables recovery of the contribution to the switching delay that is precisely introduced by the use of low supply voltages.

Finally, it is clear that modifications and variations may be made to what is described and illustrated herein, without thereby departing from the scope of the present invention as defined in the attached claims.

For example, in low-consumption applications, in which it is necessary to turn off completely the output buffers when they are not used, pre-biasing of the gate terminals of the pull-up and pull-down transistors 6, 8 of the output stage 4 could be obtained by using natural transistors, which, as is known, have a threshold voltage lower than that of the enhancement transistors typically used in output buffers.

For example, in the case where the PMOS transistor 38 of the pre-biasing stage 18 and the NMOS transistor 56 of the pre-biasing stage 20 were natural transistors, the gate terminals of the pull-up transistor 6 and pull-down transistor 8 would be respectively pre-biased at a voltage $V_G = V_{DD} - V_{THPnat}$, with $|V_{THPnat}| < |V_{THPenh}|$, and at a voltage $V_G = V_{DD} + V_{THNnat}$, with $|V_{THNnat}| < |V_{THNenh}|$, with a consequent evident benefit in terms of current consumption of th output stage 4 of the output buffer (the pull-up transistor 6 and pull-down transistor 8 would, in fact, be "less pre-biased"), but with a smaller advantage in terms of switching times.

What is claimed is:

1. An output buffer for a memory device, comprising:
    an output stage formed by a first transistor and a second transistor connected in series between a first line set at a first potential and a second line set at a second potential; and
    pre-biasing means for pre-biasing control terminals of said first and second transistors in such a way as to bring the respective control terminals to respective turning-on thresholds of the transistors.

2. The output buffer according to claim 1, further comprising:
    a first driving stage for driving said first transistor, including first inverter means which have an input connected to an input of said output buffer, and an output connected to a control terminal of said first transistor, and which include a third and a fourth transistors having first terminals connected to the output of the first inverter means, second terminals respectively connected to said first line and to said second line, and control terminals connected to the input of the first inverter means; and
    a second driving stage for driving said second transistor, including second inverter means which have an input connected to said input of said output buffer, and an output connected to a control terminal of said second transistor, and which include a fifth and a sixth transistors having first terminals connected to the output of the second inverter means, second terminals respectively connected to said first line and to said second line, and control terminals connected to the input of the second inverter means;
    and wherein said pre-biasing means includes:
    a first pre-biasing stage for pre-biasing the control terminal of said first transistor, including first unidirectional means connected between the output of said first inverter means and said third transistor of the first inverter means, and first switching means connected between the output of the first inverter means and said second line; and
    a second pre-biasing stage for pre-biasing the control terminal of said second transistor, including second unidirectional means connected between the output of the second inverter means and said fourth transistor of the second inverter means, and second switching means connected between the output of the second inverter means and said first line.

3. The output buffer according to claim 2 wherein said first and second unidirectional means comprise respective diode-connected transistors.

4. The output buffer according to claim 2 wherein said first and second switching means comprise respective transistors.

5. The output buffer according to claim 2 wherein said first switching means comprise a first fast-precharging branch and a first holding branch connected in parallel between the output of said first inverter means and said second line, and in that said second switching means comprise a second fast-precharging branch and a second holding branch connected in parallel between the output of said second inverter means and said first line.

6. The output buffer according to claim 5, wherein said first and second fast-precharging branches and said first and second holding branches each comprise a pair of transistors connected in series, a first transistor of said pair of transistors receiving on a control terminal a control signal and a second transistor of said pair of transistors having a control terminal set at a reference voltage.

7. The output buffer according to claim 6, wherein the first transistors of said first and second fast-precharging branches have larger sizes than the first transistors of said first and second holding branches.

8. The output buffer according to any of claims 2, further comprising third switching means selectively activatable for short-circuiting said first unidirectional means, and fourth switching means selectively activatable for short-circuiting said second unidirectional means.

9. The output buffer according to claim 8 wherein said third and fourth switching means comprise respective transistors.

10. A memory device, comprising an output buffer that includes:
an output stage formed by a first transistor and a second transistor connected in series between a first line set at a first potential and a second line set at a second potential; and
pre-biasing means for pre-biasing control terminals of said first and second transistors in such a way as to bring the latter to the turning-on threshold.

11. A device, comprising:
a first line at a first potential;
a second line at a second potential;
first and second transistors coupled in series between the first and second lines, and defining, between the first and second transistors, an output node;
a first circuit configured to bias the first transistor at its turning-on threshold during a period in which the second transistor is on; and
a second circuit configured to bias the second transistor at its turning-on threshold during a period in which the first transistor is on.

* * * * *